(12) United States Patent
Hu et al.

(10) Patent No.: US 10,818,798 B2
(45) Date of Patent: Oct. 27, 2020

(54) DISPLAY PANEL, ARRAY SUBSTRATE, THIN FILM TRANSISTOR AND METHOD FOR MANUFACTURING THE SAME

(71) Applicants: Hefei Xinsheng Optoelectronics Technology Co., Ltd., Hefei, Anhui (CN); BOE TECHNOLOGY GROUP CO., LTD., Beijing (CN)

(72) Inventors: Yingbin Hu, Beijing (CN); Ce Zhao, Beijing (CN); Yuankui Ding, Beijing (CN); Jun Wang, Beijing (CN); Jun Liu, Beijing (CN); Guangyao Li, Beijing (CN); Yongchao Huang, Beijing (CN); Wei Li, Beijing (CN); Liangchen Yan, Beijing (CN)

(73) Assignees: Hefei Xinsheng Optoelectronics Technology Co., Ltd., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/410,823

(22) Filed: May 13, 2019

(65) Prior Publication Data
US 2020/0168744 A1 May 28, 2020

(30) Foreign Application Priority Data
Nov. 23, 2018 (CN) .......................... 2018 1 1408713

(51) Int. Cl.
*H01L 29/786* (2006.01)
*H01L 29/66* (2006.01)
*H01L 27/12* (2006.01)

(52) U.S. Cl.
CPC .. *H01L 29/78633* (2013.01); *H01L 29/66969* (2013.01); *H01L 29/7869* (2013.01); *H01L 27/124* (2013.01); *H01L 27/127* (2013.01); *H01L 27/1225* (2013.01); *H01L 27/1288* (2013.01)

(58) Field of Classification Search
CPC ................................................. H01L 29/78633
USPC .......................................................... 257/59
See application file for complete search history.

(56) References Cited

U.S. PATENT DOCUMENTS

2015/0187750 A1* 7/2015 Kim .................. G02F 1/136286
257/43
2018/0175077 A1* 6/2018 Koo ..................... H01L 27/1251

* cited by examiner

*Primary Examiner* — Ajay Arora
(74) *Attorney, Agent, or Firm* — Foley & Lardner LLP

(57) ABSTRACT

A method for manufacturing a thin film transistor includes forming a light shielding layer and a buffer layer covering the light shielding layer on a substrate. The method includes forming an active layer including a peripheral region and a channel region. The method includes forming a gate insulating layer covering the channel region and forming a contact hole exposing the light shielding layer. The method includes forming a source region and a drain region disposed on both sides of the channel region. The method includes forming an electrode layer including a gate electrode, a source electrode and a drain electrode spaced apart one another. The method includes forming a dielectric layer covering the gate electrode, the source electrode, the drain electrode and the buffer layer.

20 Claims, 10 Drawing Sheets

DISPLAY PANEL, ARRAY SUBSTRATE, THIN FILM TRANSISTOR AND METHOD FOR MANUFACTURING THE SAME

CROSS-REFERENCE TO RELATED APPLICATIONS

The present application claims priority to Chinese Patent Application No. 201811408713.6 and filed Nov. 23, 2018, the entire contents of which are incorporated herein by reference.

TECHNICAL FIELD

The present disclosure relates to the field of display technologies, and more particularly, to a display panel, an array substrate, a thin film transistor and a method for manufacturing the same.

BACKGROUND

At present, display panels, especially OLED (Organic Light Emitting Diode) display panels, are more and more widely used. Thin film transistors are indispensable electronic devices in existing display panels and top gate type thin film transistors are very common ones. In existing technology, an dielectric layer of a thin film transistor is prone to cracks, which results in poor product; and impedance at a location where a drain electrode and a light shielding layer are bonded is high, which affects performance, and it is quite difficult to perform processes at the location where the drain electrode and the light shielding layer are bonded.

It should be noted that the foregoing information disclosed in Background are only for the purpose of enhancement of the understanding of the background of the present disclosure and therefore the information can include information that does not constitute the existing technology already known to those of ordinary skill in the art.

SUMMARY

The present disclosure is to provide a display panel, an array substrate, a thin film transistor and a method for manufacturing the same.

According to an aspect of the present disclosure, there is provided a method for manufacturing a thin film transistor. The method includes forming a light shielding layer and a buffer layer covering the light shielding layer on a substrate. The method includes forming an active layer on a surface of the buffer layer away from the substrate, the active layer including a peripheral region and a channel region located within the peripheral region. The method includes forming a gate insulating layer covering the channel region of the active layer and forming a contact hole exposing the light shielding layer in the buffer layer. The gate insulating layer exposes the peripheral region. The method includes performing conductorization processing on at least a portion of the peripheral region to form a source region and a drain region disposed on both sides of the channel region. The method includes forming an electrode layer including a gate electrode, a source electrode and a drain electrode which are spaced apart one another. The gate electrode covers the channel region. The source electrode covers the source region, a portion of the gate insulating layer and a portion of the buffer layer; the drain electrode covering the drain region, a portion of the gate insulating layer and a portion of the buffer layer; and the drain electrode being connected to the light shielding layer through the contact hole. The method includes forming a dielectric layer covering the gate electrode, the source electrode, the drain electrode and the buffer layer.

In an exemplary arrangement of the present disclosure, forming a gate insulating layer covering the channel region of the active layer and forming a contact hole exposing the light shielding layer in the buffer layer, the gate insulating layer exposing the peripheral region includes forming an insulating material layer covering the active layer and the buffer layer. Suhc an operation further includes patterning the insulating material layer via a gray-scale mask process to form a gate insulating layer and a contact hole exposing the light shielding layer.

In an exemplary arrangement of the present disclosure, patterning the insulating material layer via a gray-scale mask process to form a gate insulating layer and a contact hole exposing the light shielding layer includes forming a first photoresist layer on a surface of the insulating material layer away from the substrate. Such an operation further includes exposing and developing the first photoresist layer by using a first gray-scale mask to form a first removal region, a first remaining region and a first partial remaining region. The first removal region includes an open pore exposing the buffer layer and the open pore being located in the first partial remaining region. The operation further includes etching the first removal region to form a contact hole exposing the light shielding layer. The operation further includes removing the first partial remaining region and etching a region of the insulating material layer corresponding to the first partial remaining region to form a gate insulating layer. The operation further includes removing the first remaining region.

In an exemplary arrangement of the present disclosure, forming an electrode layer including a gate electrode, a source electrode and a drain electrode which are spaced apart one another; the gate electrode covering the channel region; the source electrode covering the source region, a portion of the gate insulating layer and a portion of the buffer layer; the drain electrode covering the drain region, a portion of the gate insulating layer and a portion of the buffer layer; and the drain electrode being connected to the light shielding layer through the contact hole includes forming a conductive layer covering the gate insulating layer and the buffer layer and the conductive layer filling the contact hole. Such an operation further includes forming an electrode layer including a gate electrode, a source electrode and a drain electrode which are spaced apart one another by a gray-scale mask process. The gate electrode covers the channel region; the source electrode covering the source region, a portion of the gate insulating layer and a portion of the buffer layer. The drain electrode covers the drain region, a portion of the gate insulating layer and a portion of the buffer layer. The drain electrode is connected to the light shielding layer through the contact hole.

In an exemplary arrangement of the present disclosure, forming an electrode layer including a gate electrode, a source electrode and a drain electrode which are spaced apart one another by a gray-scale mask process; the gate electrode covering the channel region; the source electrode covering the source region, a portion of the gate insulating layer and a portion of the buffer layer; the drain electrode covering the drain region, a portion of the gate insulating layer and a portion of the buffer layer; and the drain electrode being connected to the light shielding layer through the contact hole includes forming a second photoresist layer on a surface of the conductive layer away from the substrate. Such an operation further includes exposing and developing the second photoresist layer through a second gray-scale mask to form a second removal region, a second remaining region and a second partial remaining region. The operation further includes etching the second removal region. The operation further includes removing the second partial remaining region, and etching a region of the conductive layer corresponding to the second partial remaining region to form an electrode layer including a gate electrode, a source electrode and a drain electrode which are spaced apart one another. The gate electrode covers the channel region. The source electrode covers the source region, a portion of the gate insulating layer and a portion of the buffer layer. The drain electrode covers the drain region, a portion of the gate insulating layer and a portion of the buffer layer. The drain electrode is connected to the light shielding layer through the contact hole. The operation further includes removing the second remaining region.

In an exemplary arrangement of the present disclosure, the manufacturing method further includes forming an insulator between the gate electrode and the source electrode and between the gate electrode and the drain electrode.

In an exemplary arrangement of the present disclosure, the manufacturing method further includes forming a first via hole exposing the gate electrode, a second via hole exposing the source electrode and a third via hole exposing the drain electrode are formed on the dielectric layer. The manufacturing method further includes forming a gate line, a source line and a drain line which are spaced apart from each other on a surface of the dielectric layer away from the active layer. The gate line is connected to the gate electrode through the first via hole. The source line is connected to the source electrode through the second via hole. The drain line is connected to the drain electrode through the third via hole.

According to an aspect of the present disclosure, there is provided a thin film transistor manufactured by the manufacturing method according to any one of the above described.

According to an aspect of the present disclosure, there is provided an array substrate including the thin film transistor according to any one of the above described.

According to an aspect of the present disclosure, there is provided a display panel including the array substrate according to any one of the above described.

The present disclosure provides a display panel, an array substrate, a thin film transistor and a method for manufacturing the thin film transistor, prior to the forming of a dielectric layer, an electrode layer is formed, which includes a source electrode covering a source region, a portion of a gate insulating layer and a portion of a buffer layer, a drain electrode covering a drain region, a portion of the gate insulating layer and a portion of the buffer layer. As such, the active layer and the gate insulating layer are covered, which are in the form of two blocks.

It shall be understood that the above general description and the following detailed description are merely exemplary and explanatory and are not intended to be restrictive of the present disclosure.

BRIEF DESCRIPTION OF THE DRAWINGS

The accompanying drawings herein which are incorporated into and constitute a part of the description, illustrate the arrangements according to the present disclosure, and serve as explaining the principles of the present disclosure together with the description. Obviously, the drawings in the description below are merely for illustrating some arrangements of the present disclosure, and other drawings may be obtained by those skilled in the art according to these drawings without paying any creative work.

DETAILED DESCRIPTION

Figure 1:
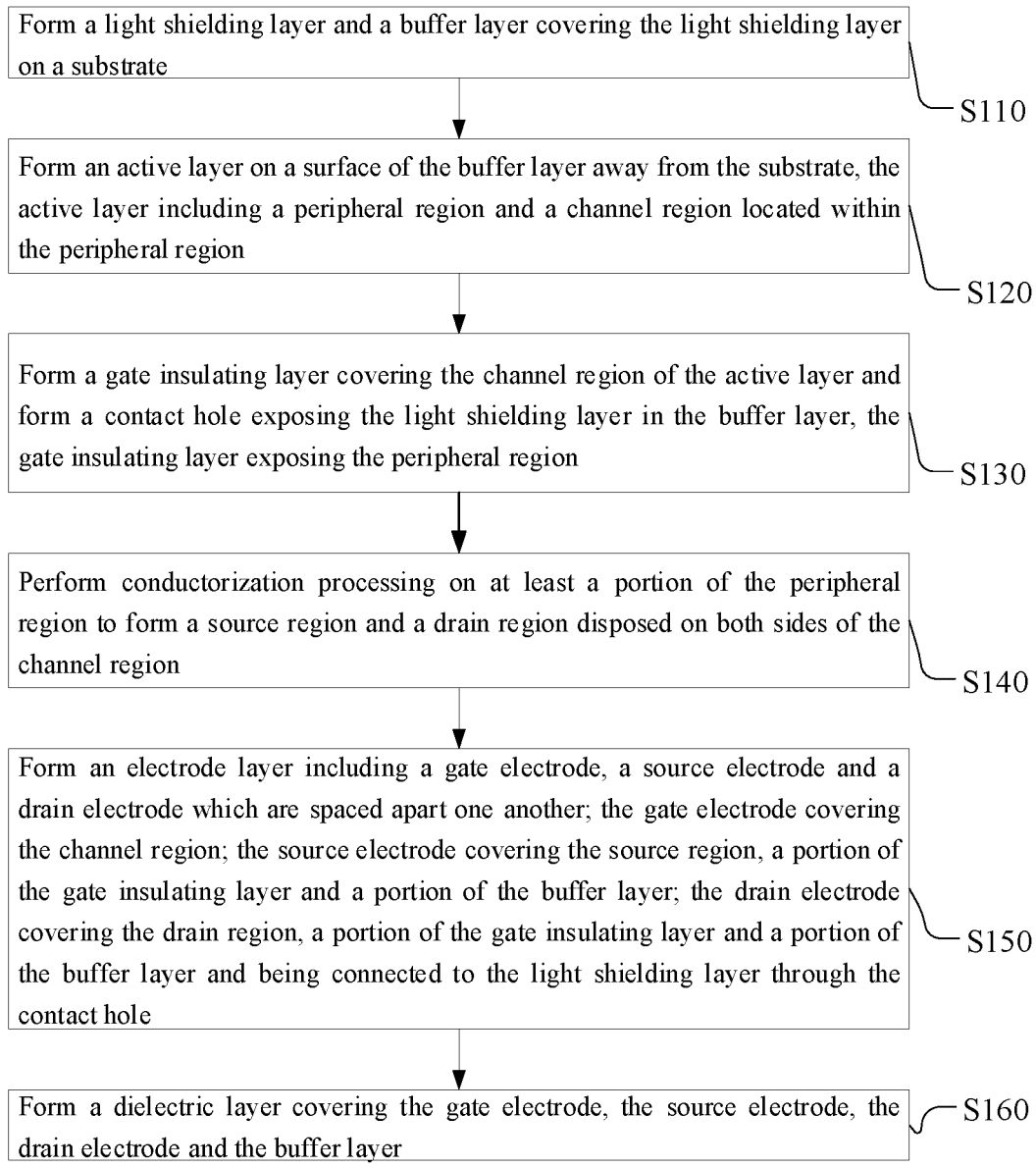
FIG. 1 is a flow chart of a manufacturing method according to an arrangement of the present disclosure.

The exemplary arrangements will now be described more fully with reference to the accompanying drawings. However, the exemplary arrangements can be implemented in various forms and should not be understood as being limited to the examples set forth herein; rather, these arrangements are provided so that this disclosure will be thorough and complete, and the conception of exemplary arrangements will be fully conveyed to those skilled in the art. The same reference signs in the drawings denote the same or similar structures, and detailed descriptions thereof will be omitted.

Although relative terms such as "upper" and "lower" are used in this specification to describe a relative relationship of one component to another component of an icon, these terms are used in this specification for convenience only, for example, based on a direction of an example illustrated in the accompanying drawings. It will be understood that if a device of the icon is flipped upside down, the "upper" component will become the "lower" component. When one structure is "on" the other structure, which means that the structure is integrally formed on the other structure, or the structure is "directly" disposed on the other structure, or the structure is "indirectly" disposed on the another structure through another structure.

Terms "a", "an", "the", "said" and "at least one" are used to denote the presence of one or more elements/constituent parts/etc; terms "including" and "having" represent open including and refer to additional elements/constituent parts/ etc in addition to the listed elements/ constituent parts/etc; terms "first", "second" and "third" are only used as a token, rather than a limit on the number of objects.

In addition, although the various blocks of the method of the present disclosure are described in a particular order in the figures, it is not required or implied that the blocks must be performed in the particular order, or all the illustrated blocks must be performed to achieve the desired result. Additionally or alternatively, some blocks may be omitted, or multiple blocks may be combined into one block to be performed, and/or one block is decomposed into multiple blocks to be performed.

In the related art, a top gate type thin film transistor generally includes a light shielding layer, a buffer layer covering the light shielding layer and an active layer, a gate insulating layer and a gate electrode sequentially laminated on the buffer layer and they are covered by an dielectric layer. The active layer includes source and drain regions that are not covered by the gate insulating layer but covered by the dielectric layer. The active layer and the gate insulating layer are disposed in the fashion of two blocks, so that the dielectric layer is prone to cracks, which affects the product yield.

In order to realize the bonding of the drain electrode and the light shielding layer, the open pore of two contact holes is required, one of them penetrates through the dielectric layer and the buffer layer to expose the light shielding layer, and the other one penetrates the dielectric layer to expose the drain electrode. A drain line is formed on a surface of the dielectric layer away from the substrate to fill the two contact holes, so as to bond the drain electrode and the light shielding layer. However, the open pore of the contact hole penetrating through the dielectric layer and the buffer layer needs long-distance and long-term etching with a quite difficult process. Moreover, the contact hole penetrating through the dielectric layer and the buffer layer has a large depth, which increases impedance of the drain line and deteriorates the product performance.

An arrangement of the present disclosure provides a method for manufacturing a thin film transistor. The thin film transistor may be applied to an OLED display panel and may be a top gate type thin film c transistor. As shown in FIG. 1, the manufacturing method of the arrangement of the present disclosure may include the following blocks.

In block S110, a light shielding layer and a buffer layer covering the light shielding layer are formed on a substrate.

In block S120, an active layer is formed on a surface of the buffer layer away from the substrate, the active layer including a peripheral region and a channel region located within the peripheral region.

In block S130, a gate insulating layer covering the channel region of the active layer is formed and a contact hole exposing the light shielding layer is formed in the buffer layer, the gate insulating layer exposing the peripheral region.

In block S140, conductorization processing is performed on at least a portion of the peripheral region to form a source region and a drain region disposed on both sides of the channel region.

In block S150, an electrode layer including a gate electrode, a source electrode and a drain electrode which are spaced apart one another is formed; the gate electrode covering the channel region; the source electrode covering the source region, a portion of the gate insulating layer and a portion of the buffer layer; the drain electrode covering the drain region, a portion of the gate insulating layer and a portion of the buffer layer; and the drain electrode being connected to the light shielding layer through the contact hole.

In block S160, a dielectric layer covering the gate electrode, the source electrode, the drain electrode and the buffer layer is formed.

In an manufacturing method according to an arrangement of the present disclosure, prior to the forming of a dielectric layer, an electrode layer is formed, which includes a source electrode covering a source region, a portion of a gate insulating layer and a portion of a buffer layer, a drain electrode covering a drain region, a portion of the gate insulating layer and a portion of the buffer layer, so that the active layer and the gate insulating layer are covered, which are in the form of two blocks. When the dielectric layer is formed, it only needs to climb over one block of the source electrode and the drain electrode, so that the number of blocks in the dielectric layer is reduced, which avoids cracks of the dielectric layer due to lots of blocks and thus improves product yield. Meanwhile, the drain electrode may realize the bonding of the drain region and the light shielding layer through a contact hole of the buffer layer, so that the open pore of a contact hole on the dielectric layer is avoided and a depth of the contact hole is reduced, which facilitates etching and reduces the difficulty of processes, and it is also beneficial to the reducing of an impedance at the location where the drain region and the light shielding layer are bonded and the improving of product performance.

The blocks of the manufacturing method according to the arrangement of the present disclosure will be described in detail below.

In block S110, a light shielding layer and a buffer layer covering the light shielding layer are formed on the substrate.

Figure 8:
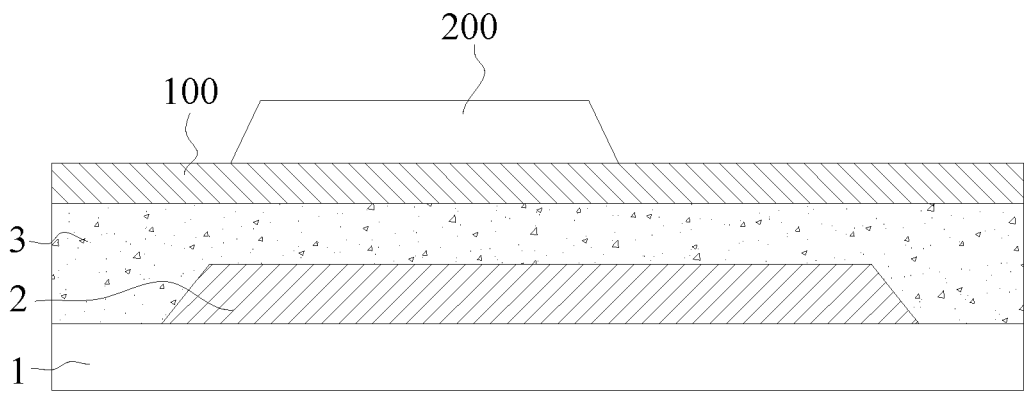
FIG. 8 is a schematic structural diagram of block S1230 of the manufacturing method in FIG. 2.

As shown in FIG. 8, a light shielding layer 2 may be directly formed on a surface of a substrate 1 and cover a portion of a region of the substrate 1. The light shielding layer 2 is made of a reflective material, for example, the light shielding layer 2 may be metal or alloy that reflects light such as molybdenum, aluminum, copper, chromium, tungsten, titanium or tantalum. For example, a light shielding material layer may be formed on the surface of the substrate 1 by a process such as sputtering or vapor deposition, and the light shielding material layer then is subject to patterning processing to obtain the light shielding layer 2. The patterning processing may be wet etching or dry etching. Certainly, the light shielding layer 2 may also be formed by other methods such as printing.

As shown in FIG. 8, a buffer layer 3 may cover the light shielding layer 2 and a portion of the region of the substrate 1 that is not covered by the light shielding layer 2. The buffer layer 3 may be made of an insulating material such as silicon oxide or silicon nitride and the present disclosure does not impose any limitation on its material. The buffer layer 3 may be formed by chemical vapor deposition or other processes and the present disclosure does not impose any limitation on the forming processes of the buffer layer 3.

Figure 2:
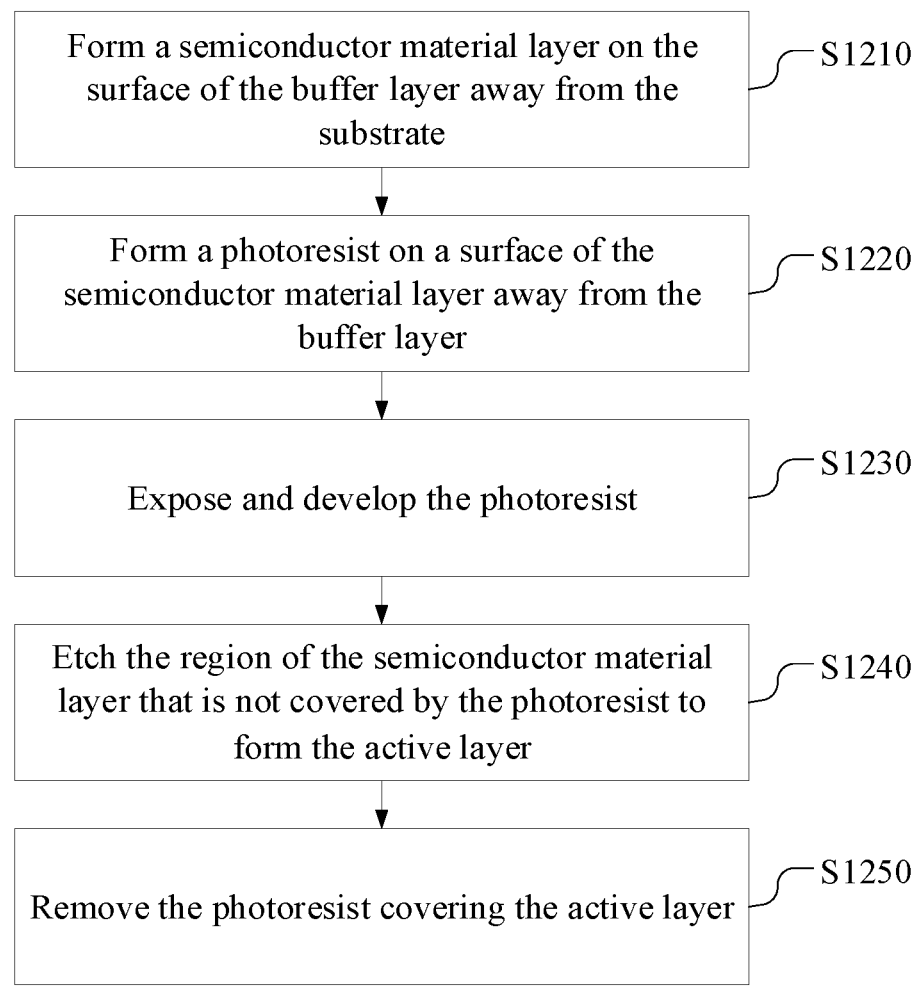
FIG. 2 is a flow chart of block S120 of a manufacturing method according to an arrangement of the present disclosure.

In an arrangement, as shown in FIG. 2, the light shielding layer 2 may be formed on the surface of the substrate 1 at first and the buffer layer 3 is then formed. The buffer layer 3 may cover the light shielding layer 2 and a region of the substrate 1 that is not covered by the light shielding layer 2. The manner of the forming of the light shielding layer 2 and the buffer layer 3 will not be elaborated herein.

In block S120, an active layer is formed on a surface of the buffer layer away from the substrate, the active layer including a peripheral region and a channel region located within the peripheral region.

Figure 9:
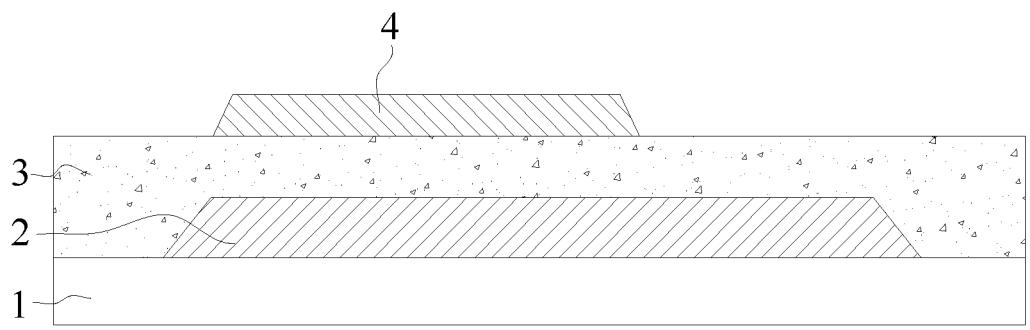
FIG. 9 is a schematic structural diagram of block S1250 of the manufacturing method in FIG. 2.

As shown in FIG. 9, an active layer 4 may be located on the buffer layer 3 and correspond to the light shielding layer 2 which may block light for the active layer 4. The active layer 4 may be made of a metal oxide such as indium gallium zinc oxide (IGZO), but it is not limited thereto. The active layer 4 may also be one or more of aluminum zinc oxide (AZO), indium zinc oxide (IZO), zinc oxide (ZnO), indium oxide ($In_2O_3$), boron-doped zinc oxide (BZO) and magnesium-doped zinc oxide (MZO). In addition, the active layer 4 may also be made of a polysilicon material or other materials, which will not be enumerated here. The active layer 4 has a peripheral region and a channel region which is located in the peripheral region.

In an arrangement, the active layer 4 may be formed on a surface of the buffer layer 3 away from the substrate 1 by mask processing. For example, the block S120 may include blocks S1210-S1250.

In the block S1210, a semiconductor material layer is formed on the surface of the buffer layer away from the substrate.

A semiconductor material layer 100 may cover the surface of the buffer layer 3 away from the substrate 1 and may be stacked with the buffer layer 3. The semiconductor material layer 100 may be made of a metal oxide such as indium gallium zinc oxide (IGZO) and the material of the active layer 4 described above may be referred to for details.

In the block S1220, a photoresist is formed on a surface of the semiconductor material layer away from the buffer layer.

A photoresist 200 may be formed on a surface of the semiconductor material layer 100 away from the buffer layer 3 by spin coating or other methods. The photoresist 200 may be a positive photoresist or a negative photoresist and may cover the surface of the semiconductor material layer 100 away from the buffer layer 3.

In the block S1230, the photoresist is exposed and developed.

As shown in FIG. 8, the photoresist 200 may be exposed by a mask and developed by a developer to expose a portion of a region of the semiconductor material layer 100.

In the block S1240, the portion of the region of the semiconductor material layer that is not covered by the photoresist is etched to form the active layer.

The portion of the region of the semiconductor material layer 100 that is not covered by the photoresist 200 may be etched by a wet or dry etching process until the buffer layer 3 is exposed, so the active layer 4 is formed.

In the block S1250, the photoresist covering the active layer is removed.

As shown in FIG. 9, the photoresist 200 may be removed by ashing or via other processes to expose the active layer 4.

Certainly, in another arrangement of the present disclosure, the active layer 4 may also be formed by other patterning processes, which will not be described in detail herein.

In block S130, a gate insulating layer covering the channel region of the active layer is formed and a contact hole exposing the light shielding layer is formed in the buffer layer, the gate insulating layer exposing the peripheral region.

Figure 12:
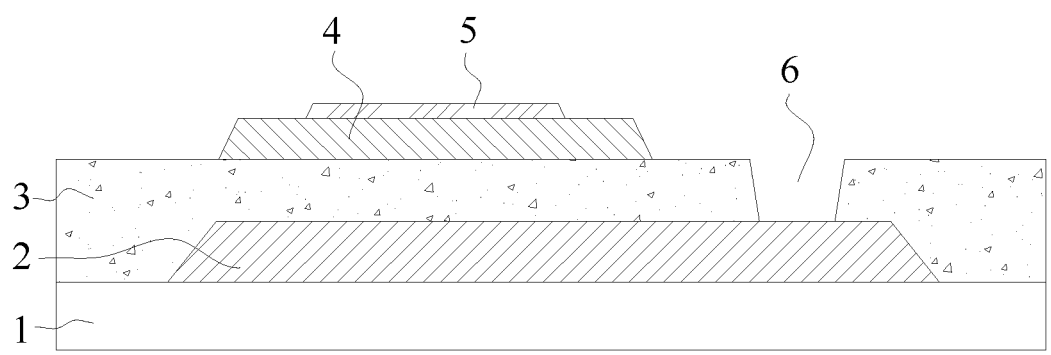
FIG. 12 is a schematic structural diagram of block S13250 of the manufacturing method in FIG. 4.

As shown in FIG. 12, a gate insulating layer 5 may be stacked on a surface of the active layer 4 away from the substrate 1. The gate insulating layer 5 may be made of an insulating material such as silicon oxide or silicon nitride and the present disclosure does not impose limitation on the material of the gate insulating layer 5. Meanwhile, the gate insulating layer 5 may cover only the channel region without covering the peripheral region, that is, an orthographic projection of the gate insulating layer 5 on the active layer 4 coincides with the channel region of the active layer 4.

A contact hole 6 may be in a region of the buffer layer 3 that is not covered by the active layer 4 and may correspond to the light shielding layer 2. Meanwhile, the contact hole 6 may penetrate the buffer layer 3 and expose the light shielding layer 2.

Figure 3:
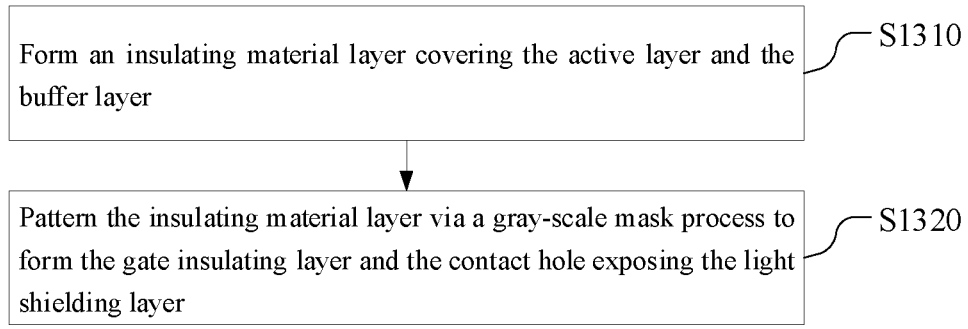
FIG. 3 is a flowchart of block S130 of a manufacturing method according to an arrangement of the present disclosure.

In an arrangement, as shown in FIG. 3, the block S130 may include blocks S1310-S1330.

In the block S1310, an insulating material layer covering the active layer and the buffer layer is formed.

Figure 10:
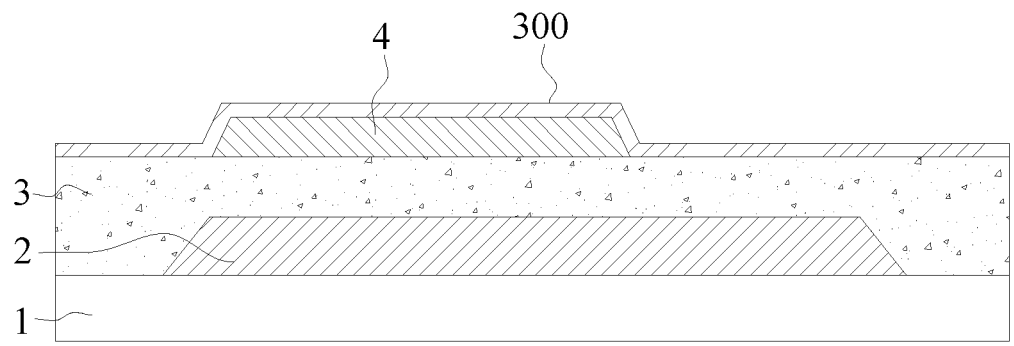
FIG. 10 is a schematic structural diagram of block S1310 of the manufacturing method in FIG. 3.

As shown in FIG. 10, an insulating material layer 300 may be formed on the buffer layer 3 on which the active layer 4 is formed by chemical vapor deposition or other processes. The insulating material layer 300 covers the active layer 4 and a region of the buffer layer 3 that is not covered by the active layer 4. The insulating material layer 300 may be made of an insulating material such as silicon oxide or silicon nitride and the present disclosure does not impose particular limitation on the material of the insulating material layer 300.

In the block S1320, the insulating material layer is patterned via a gray-scale mask process to form the gate insulating layer and the contact hole exposing the light shielding layer.

Figure 4:
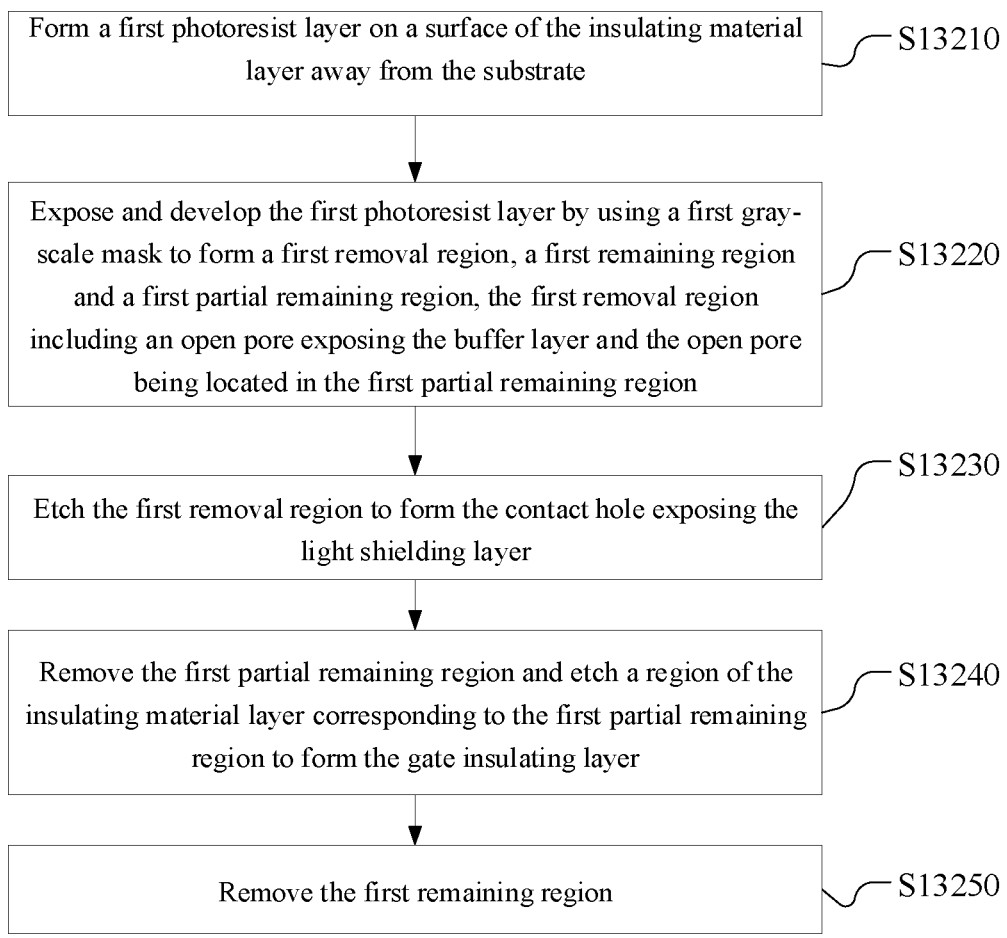
FIG. 4 is a flow chart of block S1320 of a manufacturing method according to an arrangement of the present disclosure.

As shown in FIG. 12, the gate insulating layer 5 and the contact hole 6 may be formed by a gray-scale mask process using a first gray-scale mask so as to simplify processes. As shown in FIG. 4, for example, the block S1320 may include blocks S13210-S13250.

In the block S13210, a first photoresist layer is formed on a surface of the insulating material layer away from the substrate.

A first photoresist layer 400 may be formed on a surface of the insulating material layer 300 away from the buffer layer 3 by spin coating or other methods. The first photoresist layer 400 may be made of a positive photoresist or a negative photoresist and it may cover the active layer 4 and the surface of the buffer layer 3 that is not covered by the active layer 4.

In the block S13220, the first photoresist layer is exposed and developed by using a first gray-scale mask to form a first removal region, a first remaining region and a first partial remaining region. The first removal region includes an open pore exposing the buffer layer and the open pore is located in the first partial remaining region.

Figure 11:
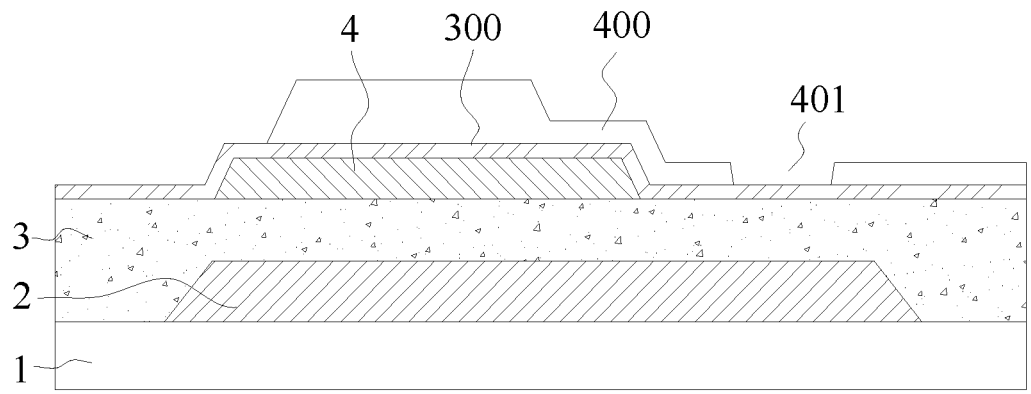
FIG. 11 is a schematic structural diagram of block S13220 of the manufacturing method in FIG. 4.

As shown in FIG. 11, the first photoresist layer 400 may be exposed by a first gray-scale mask to form an exposed region, a half-exposed region and a non-exposed region. Then, the first photoresist layer 400 may be developed to form a first removal region, a first remaining region and a first partial remaining region. The first removal region exposes a portion of the insulating material layer 300 and the first remaining region and the first partial remaining region cover a portion of the insulating material layer 300. The first remaining region has a thickness greater than a thickness of the first partial remaining region. Meanwhile, the first removal region may include an open pore 401, which may expose the insulating material layer 300. The open pore 401 is located in the first partial remaining region, that is, the open pore 401 penetrates through the first partial remaining region.

In the block S13230, the first removal region is etched to form the contact hole exposing the light shielding layer.

The open pore may be etched via dry etching or another etching process until the light shielding layer 2 is exposed, so a contact hole 6 penetrating the insulating material layer 300 and the buffer layer 3 is obtained.

In the block S13240, the first partial remaining region is removed and a region of the insulating material layer corresponding to the first partial remaining region is etched to form the gate insulating layer.

The first partial remaining region of the first photoresist layer 400 may be removed by an asking process or other process and the first remaining region is thinned. Subsequently, the region of the insulating material layer 300 corresponding to the first partial remaining region may be etched by a dry etching process until the buffer layer 3 is exposed, so as to form the gate insulating layer 5. Certainly, the etching may also be performed by a wet etching process.

In the block S13250, the first remaining region is removed.

As shown in FIG. 12, the first remaining region of the first photoresist layer 400 may be removed by ashing or other processes, that is, the first photoresist layer 400 is completely removed.

Certainly, in another arrangement of the present disclosure, the gate insulating layer 5 and the contact holes 6 may also be separately formed through two mask processes.

In block S140, conductorization processing is performed on at least a portion of the peripheral region to form a source region and a drain region disposed on both sides of the channel region.

Figure 13:
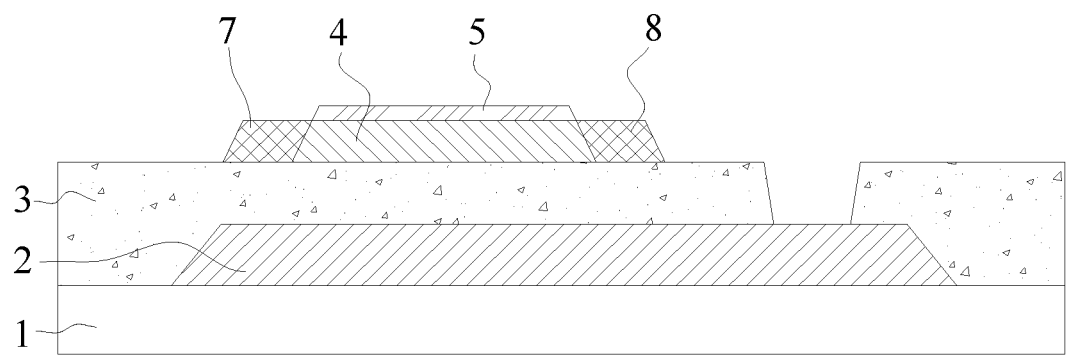
FIG. 13 is a schematic structural diagram of block S140 of the manufacturing method in FIG. 1.

As shown in FIG. 13, since the gate insulating layer 5 only covers the channel region of the active layer 4 but exposes the peripheral region, the peripheral region may be conductorized. For example, at least a portion of the peripheral region of the active layer 4 may be subjected to conductorization processing to form a source region 7 and a drain region 8 on both sides of the channel region. The source region 7 may be located on a side of the channel region away from the contact hole 6 and the drain region 8 may be located between the channel region and the contact hole 6. The conductorization of the peripheral region may be realized by an annealing process, or by laser irradiation and as long as the above-described source region 7 and drain region 8 are formed, the present disclosure does not impose particular limitation on the specific process of the conductorization.

In block S150, an electrode layer including a gate electrode, a source electrode and a drain electrode which are alternatively disposed is formed; the gate electrode covering the channel region; the source electrode covering the source region, a portion of the gate insulating layer and a portion of the buffer layer; the drain electrode covering the drain region, a portion of the gate insulating layer and a portion of the buffer layer; and the drain electrode being connected to the light shielding layer through the contact hole.

Figure 16:
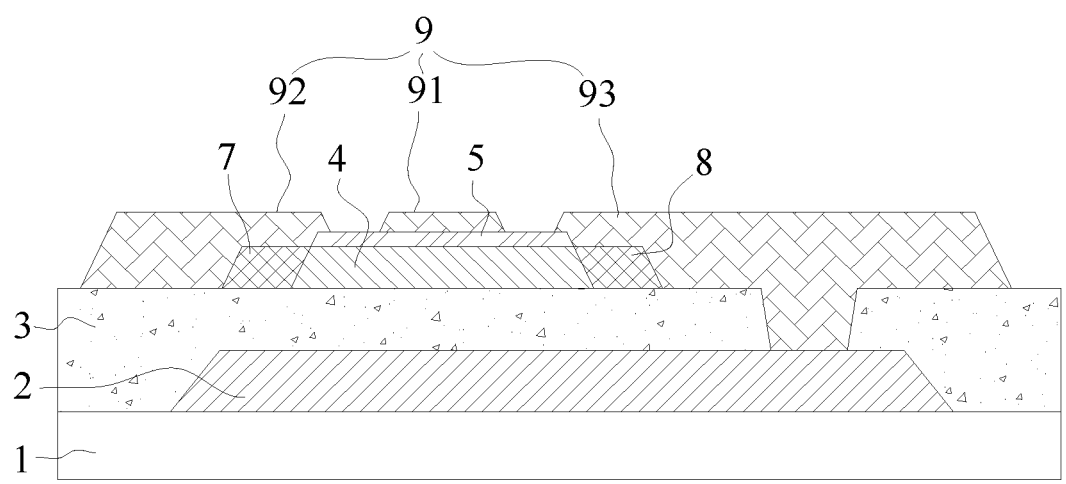
FIG. 16 is a schematic structural diagram of block S15250 of the manufacturing method of FIG. 6.

As shown in FIG. 16, an electrode layer 9 may be provided to cover the buffer layer 3 on which the active layer 4, the gate insulating layer 5 and the contact hole 6 are formed and the electrode layer 9 may be laid flat. The electrode layer 9 may be made of molybdenum, aluminum, copper, but it is not limited thereto. The electrode layer 9 may also be made of a conductive material such as chromium, tungsten, titanium, tantalum and an alloy containing them, which will not be enumerated here. Meanwhile, the electrode layer 9 may include a gate electrode 91, a source electrode 92 and a drain electrode 93 which are spaced apart one another.

The gate electrode 91 covers the channel region of the active layer 4 and a projection of the gate electrode 91 on the active layer 4 does not exceed the channel region. The source electrode 92 and the drain electrode 93 are located on both sides of the gate electrode 91. The source electrode 92 may cover a portion of the gate insulating layer 5 and extend in a direction away from the drain region 8 and cover the source region 7 of the active layer 4 and a portion of the buffer layer 3. The drain electrode 93 may cover a portion of the gate insulating layer 5 and extend in a direction away from the source region 7 and cover the drain region 8 of the active layer 4 and a portion of the buffer layer 3. The drain electrode 93 also fills the contact hole 6 and is connected to the light shielding layer 2 to achieve the bonding of the drain region 8 and the light shielding layer 2. Meanwhile, a surface of the source electrode 92 away from the gate electrode 91 and a surface of the drain electrode 93 away from the gate electrode 91 may be a plane with no protrusion or recess, which avoids the occurrence of multiple blocks on the source electrode 92 and the drain electrode 93, so that the source electrode 92 and the drain electrode 93 correspond to only one block on the buffer layer 3.

Figure 5:
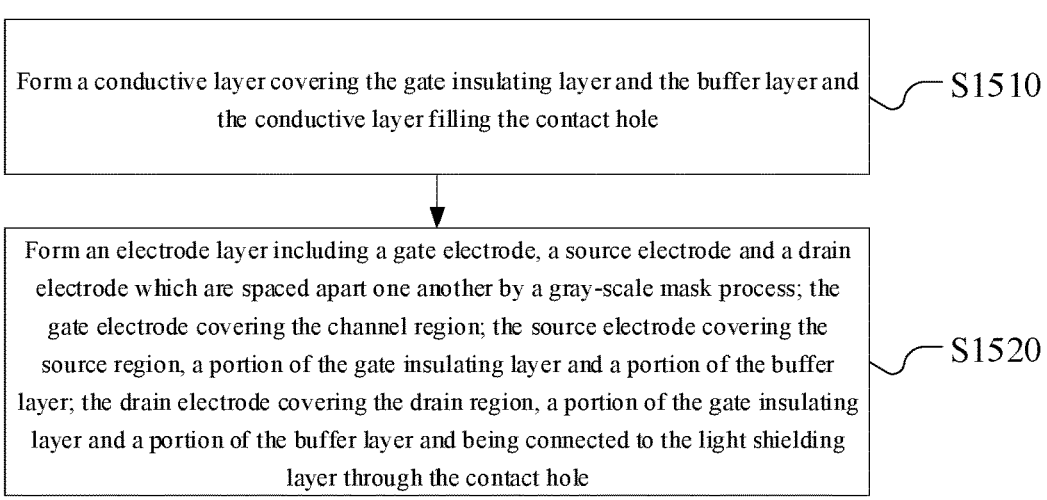
FIG. 5 is a flow chart of block S150 of a manufacturing method according to an arrangement of the present disclosure.

In an arrangement, as shown in FIG. 5, the block S150 may include blocks S1510 and S1520.

In the block S1510, a conductive layer covering the gate insulating layer and the buffer layer is formed and the conductive layer fills the contact hole.

Figure 14:
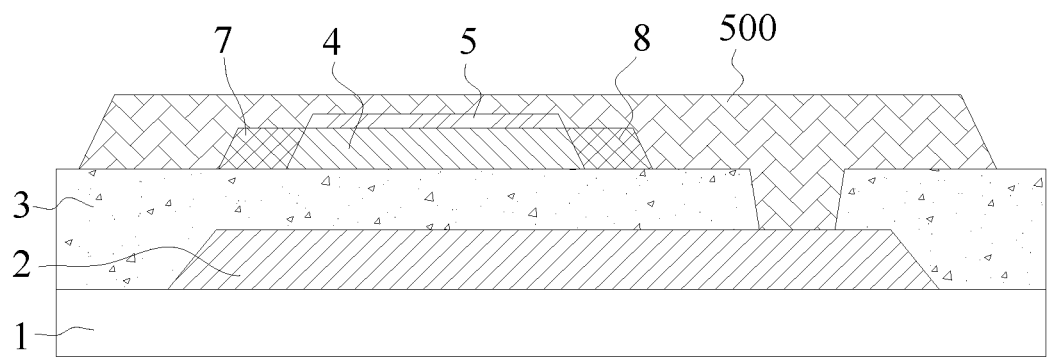
FIG. 14 is a schematic structural diagram of block S1510 of the manufacturing method of FIG. 5.

As shown in FIG. 14, a conductive layer 500 covering the gate insulating layer 5 and the buffer layer 3 may be formed by vapor deposition, sputtering or other processes and the conductive layer 500 fills the contact hole 6 and is connected to the light shielding layer 2. A material of the conductive layer 500 is the same as that of the electrode layer 9 which will not be described in detail herein.

In the block S1520, an electrode layer including a gate electrode, a source electrode and a drain electrode which are spaced apart one another is formed by a gray-scale mask process; the gate electrode covering the channel region; the source electrode covering the source region, a portion of the gate insulating layer and a portion of the buffer layer; the drain electrode covering the drain region, a portion of the gate insulating layer and a portion of the buffer layer; and the drain electrode being connected to the light shielding layer through the contact hole.

Figure 6:
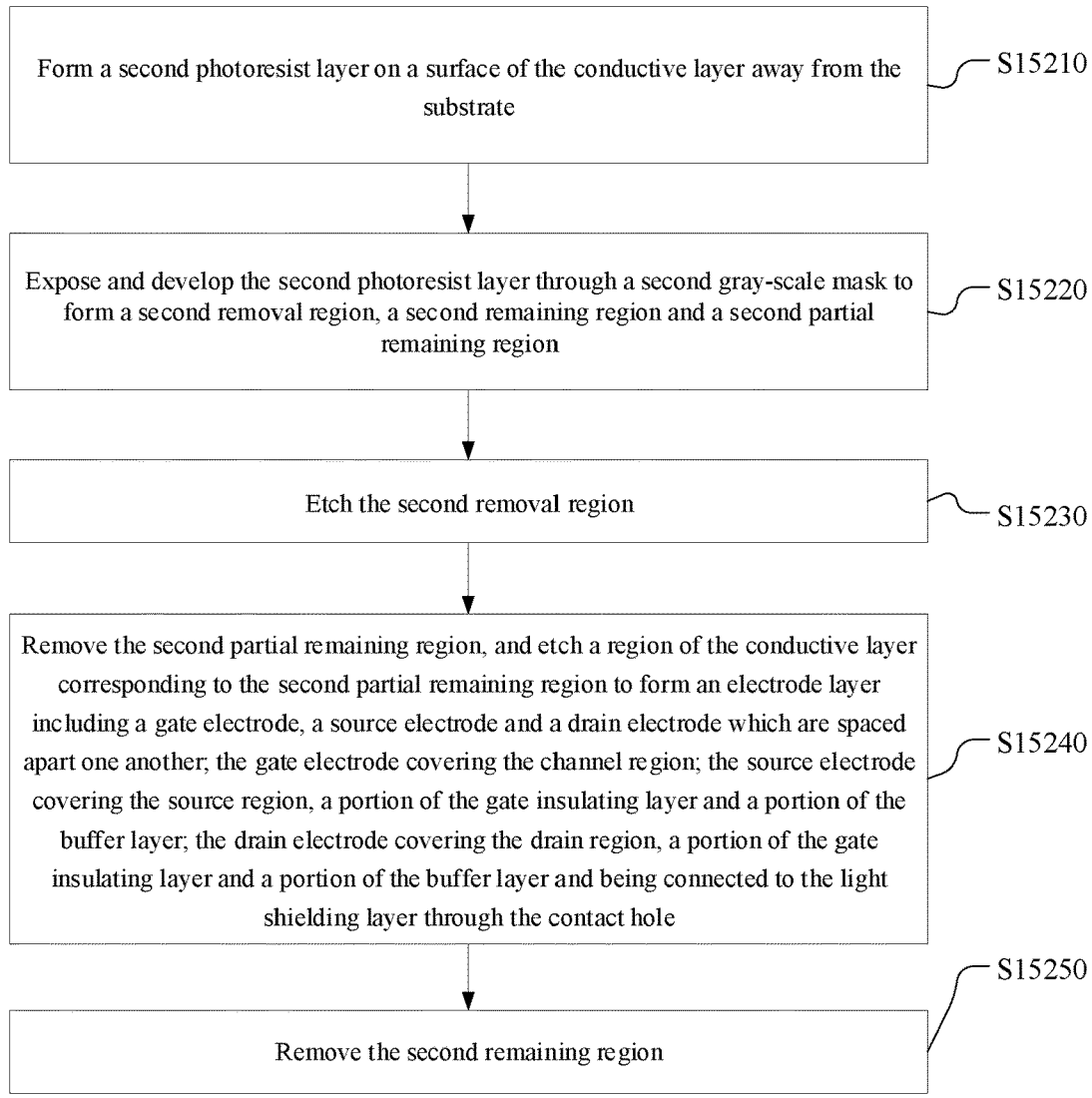
FIG. 6 is a flowchart of block S1520 of a manufacturing method according to an arrangement of the present disclosure.

In an arrangement, as shown in FIG. 6, the block S1520 may include blocks S15210-S15250.

In the block S15210, a second photoresist layer is formed on a surface of the conductive layer away from the substrate.

A second photoresist layer 600 may be formed on a surface of the conductive layer 500 away from the buffer layer 3 by spin coating or other methods. The second photoresist layer 600 may be made of a positive photoresist or a negative photoresist and may cover the conductive layer 500.

In the block S15220, the second photoresist layer are exposed and developed through a second gray-scale mask to form a second removal region, a second remaining region and a second partial remaining region.

The second gray-scale mask has a pattern different from a pattern of the first gray-scale mask and the second photoresist layer 600 may be exposed by the second gray-scale mask to form an exposed region, a half-exposed region and a non-exposed region. Then, the second photoresist layer 600 may be developed to form a second removal region, a second remaining region and a second partial remaining region. The second removal region exposes a portion of the conductive layer 500 and the second remaining region and the second partial remaining region cover a portion of the conductive layer 500. The second remaining region has a thickness greater than a thickness of the second partial remaining region.

In the block S15230, the second removal region is etched.

Figure 15:
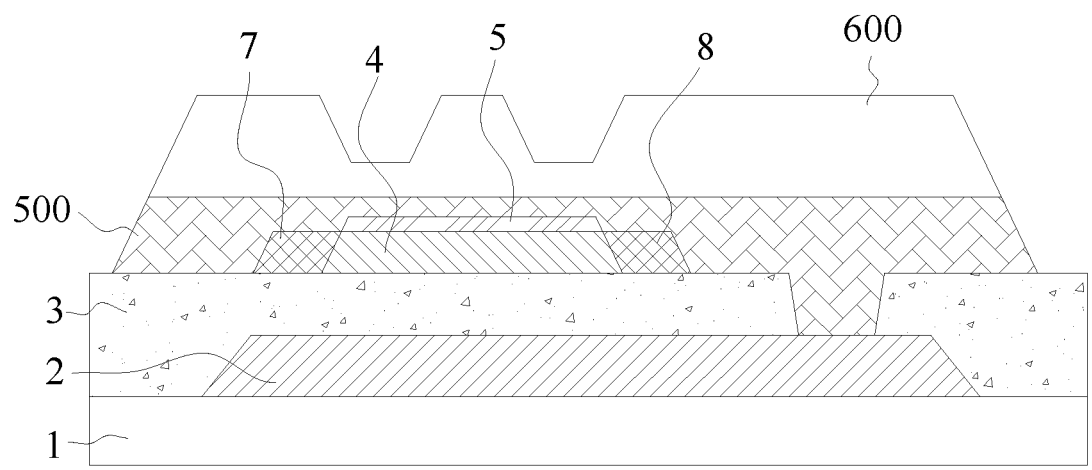
FIG. 15 is a schematic structural diagram of block S15230 of the manufacturing method in FIG. 6.

As shown in FIG. 15, the conductive layer 500 exposed in the second removal region may be etched by a dry or wet etching process until the buffer layer 3 is exposed.

In the block S15240, the second partial remaining region is removed, and a region of the conductive layer corresponding to the second partial remaining region is etched to form an electrode layer including a gate electrode, a source electrode and a drain electrode which are spaced apart one another; the gate electrode covering the channel region; the source electrode covering the source region, a portion of the gate insulating layer and a portion of the buffer layer; the drain electrode covering the drain region, a portion of the gate insulating layer and a portion of the buffer layer; and the drain electrode being connected to the light shielding layer through the contact hole.

The second partial remaining region of the second photoresist layer 600 may be removed by ashing or other processes and the second remaining region is thinned, such that the conductive layer 500 corresponding to the second partial remaining region is exposed. Then, the region of the conductive layer 500 corresponding to the second partial remaining region is etched until the gate insulating layer 5 is exposed, so regions of the gate electrode 91, the source electrode 92 and the drain electrode 93, which are spaced apart one another, are formed. The second partial remaining region may correspond to a region separating the gate electrode 91, the source electrode 92 and the drain electrode 93 from one another.

In the block S15250, the second remaining region is removed.

As shown in FIG. 16, the second remaining region of the second photoresist layer 600 may be removed by ashing or other processes to expose the gate electrode 91, the source electrode 92 and the drain electrode 93.

The electrode layer 9 may be formed through the above-described gray-scale mask process without separately forming the gate electrode 91, the source electrode 92 and the drain electrode 93 of the electrode layer 9 via a plurality of mask processes, which facilitates the simplifying of processes and the reducing of costs.

In the block S160, a dielectric layer covering the gate electrode, the source electrode, the drain electrode and the buffer layer is formed.

A dielectric layer 10 may be formed by chemical vapor deposition or other processes and may cover the electrode layer 9 and a region of the buffer layer 3 that is not covered by the electrode layer 9. The dielectric layer 10 may be made of an insulating material such as silicon oxide or silicon nitride.

The source electrode 92 and the drain electrode 93 may cover two blocks formed by the active layer 4 and the gate insulating layer 5 and the source electrode 92 and the drain electrode 93 are formed as one block, when the dielectric layer 10 is formed, the dielectric layer 10 may directly climb over a reduced number of blocks, which prevents cracks of the dielectric layer 10.

Figure 7:
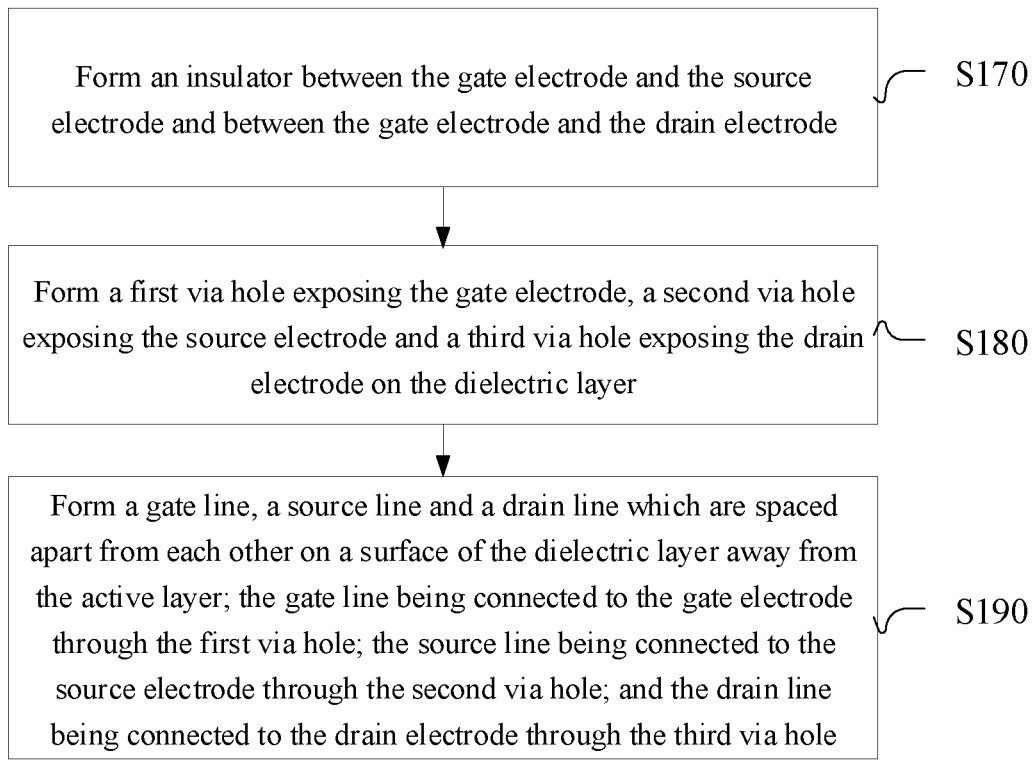
FIG. 7 is a flowchart of blocks S170 to S190 of a manufacturing method according to an arrangement of the present disclosure.

As shown in FIG. 7, the manufacturing method of the arrangement of the present disclosure may further include the following blocks.

In the block S170, an insulator is formed between the gate electrode and the source electrode and between the gate electrode and the drain electrode.

Figure 17:
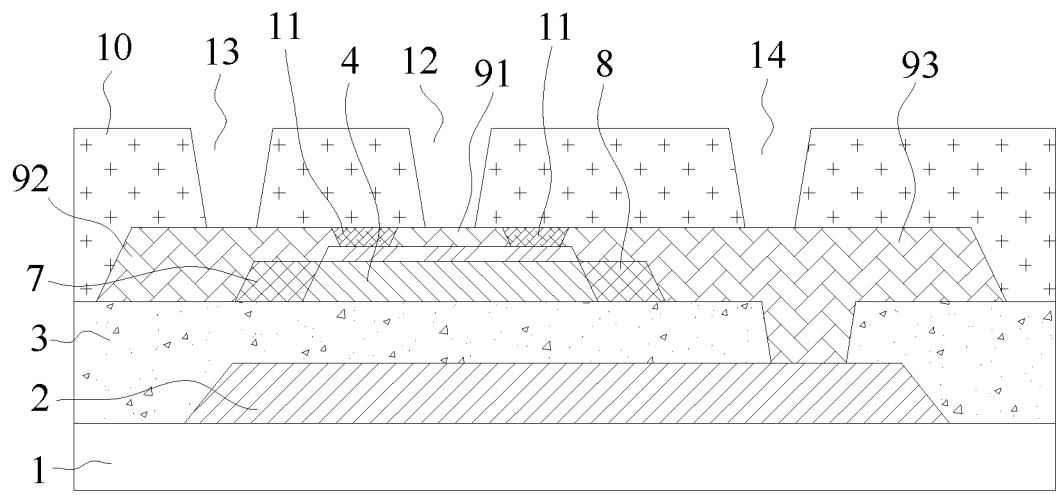
FIG. 17 is a schematic structural diagram of block S180 of the manufacturing method in FIG. 7.

As shown in FIG. 17, the insulator 11 may be made of a metal oxide or other insulating materials. Meanwhile, the insulator 11 may be disposed on the surface of the gate insulating layer 5 away from the active layer 4 and may be filled between the gate electrode 91 and the source electrode 92 and between the gate electrode 91 and the drain electrode 93. Furthermore, a surface of the insulator 11 away from the gate insulating layer 5 is flush with the surface of the electrode layer 9 away from the gate insulating layer 5, to ensure the flatness of the electrode layer 9.

As shown in FIG. 7, the manufacturing method of the arrangement of the present disclosure may further include blocks S180 and S190.

In the block S180, a first via hole exposing the gate electrode, a second via hole exposing the source electrode and a third via hole exposing the drain electrode are formed on the dielectric layer.

As shown in FIG. 17, a first via hole 12, a second via hole 13 and a third via hole 14 may be formed on the dielectric layer 10 via one or more mask processes and specific procedures of the mask process will not elaborated herein. The first via hole 12 is facing the gate electrode 91 and exposes the gate electrode 91, the second via hole 13 is facing the source electrode 92 and exposes the source electrode 92 and the third via hole 14 is facing the drain electrode 93 and exposes the drain electrode 93.

In the block S190, a gate line, a source line and a drain line which are spaced apart from each other are formed on a surface of the dielectric layer away from the active layer; the gate line being connected to the gate electrode through the first via hole; the source line being connected to the source electrode through the second via hole; and the drain line being connected to the drain electrode through the third via hole.

Figure 18:
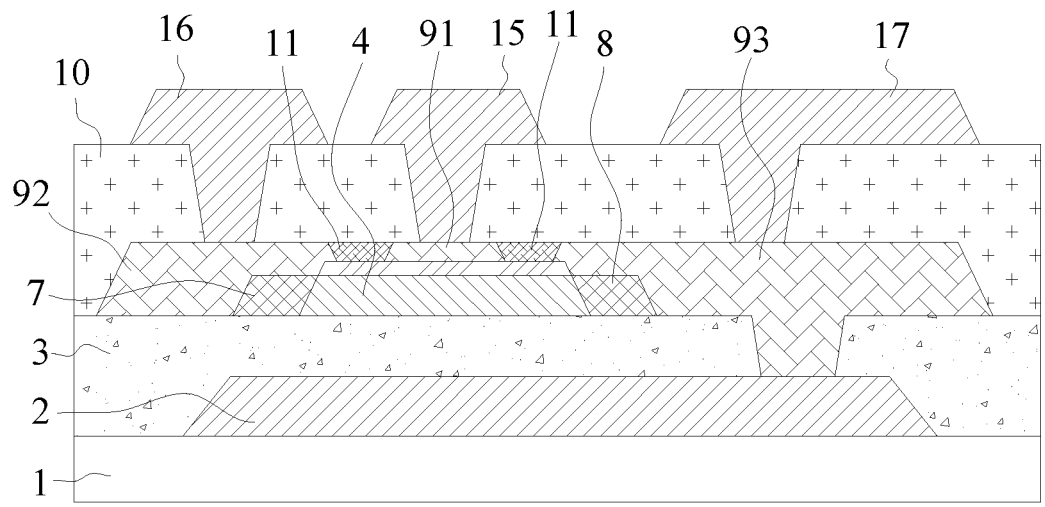
FIG. 18 is a schematic structural diagram of block S190 of the manufacturing method in FIG. 7.

As shown in FIG. 18, a gate line 15, a source line 16 and a drain line 17 may be formed on a surface of the dielectric layer 10 away from the substrate 1. Meanwhile, the gate line 15 is connected to the gate electrode 91 through the first via hole 12; the source line 16 is connected to the source electrode 92 through the second via hole 13; and the drain line 17 is connected to the drain electrode 93 through the third via hole 14.

The gate line 15, the source line 16 and the drain line 17 may be formed by one or more mask processes, which will not be particularly limited herein. The gate line 15, the source line 16 and the drain line 17 may be made of molybdenum, aluminum or copper, but it is not limited thereto. The gate line 15, the source line 16 and the drain line 17 may also be chromium, tungsten, titanium, tantalum and an alloy containing the same, which will not be elaborated herein.

An arrangement of the present disclosure provides a thin film transistor which may be a top gate type thin film transistor, as shown in FIG. 18 and may be fabricated by the method for manufacturing the thin film transistor in the above arrangements. Beneficial effects of the thin film transistor and details of various portions have been described in detail in the corresponding arrangements of the manufacturing method, which will not be elaborated herein.

An arrangement of the present disclosure provides an array substrate which may include the above-described thin film transistor and may be an OLED array substrate or a LCD array substrate. Beneficial effects of the array substrate may refer to those of the manufacturing method according to the arrangement of the present disclosure, which will not be elaborated herein.

An arrangement of the present disclosure provides a display panel which may include the above-described array substrate. The display panel can be used in a terminal device having a display function such as a mobile phone, a tablet computer or a television. Beneficial effects of the display panel may refer to those of the manufacturing method according to the arrangement of the present disclosure, which will not be elaborated herein.

Other arrangements of the present disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and arrangements be considered as exemplary only, with a true scope and spirit of the present disclosure being indicated by the following claims.

What is claimed is:

1. A method for manufacturing a thin film transistor, comprising:
    forming a light shielding layer and a buffer layer covering the light shielding layer on a substrate;
    forming an active layer on a surface of the buffer layer away from the substrate, the active layer comprising a peripheral region and a channel region located within the peripheral region;
    forming a gate insulating layer covering the channel region of the active layer and forming a contact hole exposing the light shielding layer in the buffer layer;
    performing conductorization processing on at least a portion of the peripheral region to form a source region and a drain region disposed on both sides of the channel region;
    forming an electrode layer comprising a gate electrode, a source electrode and a drain electrode spaced apart one another; the gate electrode covering the channel region; the source electrode covering the source region, a portion of the gate insulating layer and a portion of the buffer layer; the drain electrode covering the drain region, a portion of the gate insulating layer and a portion of the buffer layer; and the drain electrode being connected to the light shielding layer through the contact hole; and
    forming a dielectric layer covering the gate electrode, the source electrode, the drain electrode and the buffer layer.

2. The method according to claim 1, wherein forming a gate insulating layer covering the channel region of the active layer and forming a contact hole exposing the light shielding layer in the buffer layer, comprises:
    forming an insulating material layer covering the active layer and the buffer layer; and
    patterning the insulating material layer via a gray-scale mask process to form the gate insulating layer and the contact hole exposing the light shielding layer.

3. The method according to claim 2, wherein patterning the insulating material layer via a gray-scale mask process to form a gate insulating layer and a contact hole exposing the light shielding layer, comprises:
    forming a first photoresist layer on a surface of the insulating material layer away from the substrate;
    exposing and developing the first photoresist layer by using a first gray-scale mask to form a first removal region, a first remaining region and a first partial remaining region, the first removal region comprising an open pore exposing the buffer layer and the open pore being located in the first partial remaining region;
    etching the first removal region to form the contact hole exposing the light shielding layer;
    removing the first partial remaining region and etching a region of the insulating material layer corresponding to the first partial remaining region to form the gate insulating layer; and
    removing the first remaining region.

4. The method according to claim 1, wherein forming an electrode layer comprising a gate electrode, a source electrode and a drain electrode spaced apart one another; the gate electrode covering the channel region; the source electrode covering the source region, a portion of the gate insulating layer and a portion of the buffer layer; the drain electrode covering the drain region, a portion of the gate insulating layer and a portion of the buffer layer and; the drain electrode being connected to the light shielding layer through the contact hole, comprises:
    forming a conductive layer covering the gate insulating layer and the buffer layer and the conductive layer filling the contact hole; and
    forming the electrode layer comprising the gate electrode, the source electrode and the drain electrode spaced apart one another by a gray-scale mask process; the gate electrode covering the channel region; the source electrode covering the source region, the portion of the gate insulating layer and the portion of the buffer layer; the drain electrode covering the drain region, the portion of the gate insulating layer and the portion of the buffer layer; and the drain electrode being connected to the light shielding layer through the contact hole.

5. The method according to claim 4, wherein forming an electrode layer comprising a gate electrode, a source electrode and a drain electrode spaced apart one another by a gray-scale mask process; the gate electrode covering the channel region; the source electrode covering the source region, a portion of the gate insulating layer and a portion of the buffer layer; the drain electrode covering the drain region, a portion of the gate insulating layer and a portion of the buffer layer; and the drain electrode being connected to the light shielding layer through the contact hole, comprises:
    forming a second photoresist layer on a surface of the conductive layer away from the substrate;
    exposing and developing the second photoresist layer through a second gray-scale mask to form a second removal region, a second remaining region and a second partial remaining region;
    etching the second removal region;
    removing the second partial remaining region, and etching a region of the conductive layer corresponding to the second partial remaining region to form the electrode layer comprising the gate electrode, the source electrode and the drain electrode which are spaced apart one another; the gate electrode covering the channel region; the source electrode covering the source region, the portion of the gate insulating layer and the portion of the buffer layer; the drain electrode covering the drain region, the portion of the gate insulating layer and the portion of the buffer layer; and the drain electrode being connected to the light shielding layer through the contact hole; and removing the second remaining region.

6. The method according to claim 5, further comprising:
forming an insulator between the gate electrode and the source electrode and between the gate electrode and the drain electrode.

7. The method according to claim 1, further comprising:
forming a first via hole exposing the gate electrode, a second via hole exposing the source electrode and a third via hole exposing the drain electrode are formed on the dielectric layer; and
forming a gate line, a source line and a drain line which are spaced apart from each other on a surface of the dielectric layer away from the active layer; the gate line being connected to the gate electrode through the first via hole; the source line being connected to the source electrode through the second via hole; and the drain line being connected to the drain electrode through the third via hole.

8. The method according to claim 2, further comprising:
forming a first via hole exposing the gate electrode, a second via hole exposing the source electrode and a third via hole exposing the drain electrode are formed on the dielectric layer; and
forming a gate line, a source line and a drain line which are spaced apart from each other on a surface of the dielectric layer away from the active layer; the gate line being connected to the gate electrode through the first via hole; the source line being connected to the source electrode through the second via hole; and the drain line being connected to the drain electrode through the third via hole.

9. The method according to claim 3, further comprising:
forming a first via hole exposing the gate electrode, a second via hole exposing the source electrode and a third via hole exposing the drain electrode are formed on the dielectric layer; and
forming a gate line, a source line and a drain line which are spaced apart from each other on a surface of the dielectric layer away from the active layer; the gate line being connected to the gate electrode through the first via hole; the source line being connected to the source electrode through the second via hole; and the drain line being connected to the drain electrode through the third via hole.

10. The method according to claim 4, further comprising:
forming a first via hole exposing the gate electrode, a second via hole exposing the source electrode and a third via hole exposing the drain electrode are formed on the dielectric layer; and
forming a gate line, a source line and a drain line which are spaced apart from each other on a surface of the dielectric layer away from the active layer; the gate line being connected to the gate electrode through the first via hole; the source line being connected to the source electrode through the second via hole; and the drain line being connected to the drain electrode through the third via hole.

11. The method according to claim 5, further comprising:
forming a first via hole exposing the gate electrode, a second via hole exposing the source electrode and a third via hole exposing the drain electrode are formed on the dielectric layer; and
forming a gate line, a source line and a drain line which are spaced apart from each other on a surface of the dielectric layer away from the active layer; the gate line being connected to the gate electrode through the first via hole; the source line being connected to the source electrode through the second via hole; and the drain line being connected to the drain electrode through the third via hole.

12. The method according to claim 6, further comprising:
forming a first via hole exposing the gate electrode, a second via hole exposing the source electrode and a third via hole exposing the drain electrode are formed on the dielectric layer; and
forming a gate line, a source line and a drain line which are spaced apart from each other on a surface of the dielectric layer away from the active layer; the gate line being connected to the gate electrode through the first via hole; the source line being connected to the source electrode through the second via hole; and the drain line being connected to the drain electrode through the third via hole.

13. A thin film transistor comprising:
a substrate;
a light shielding layer formed on the substrate;
a buffer layer covering the light shielding layer;
an active layer formed on a surface of the buffer layer away from the substrate, the active layer comprising a peripheral region and a channel region located within the peripheral region;
a gate insulating layer covering the channel region of the active layer;
a contact hole formed in the buffer layer to expose the light shielding layer;
a source region and a drain region formed by performing conductorization processing on at least a portion of the peripheral region and disposed on both sides of the channel region;
an electrode layer comprising a gate electrode, a source electrode and a drain electrode spaced apart one another; the gate electrode covering the channel region; the source electrode covering the source region, a portion of the gate insulating layer and a portion of the buffer layer; the drain electrode covering the drain region, a portion of the gate insulating layer and a portion of the buffer layer; and the drain electrode being connected to the light shielding layer through the contact hole; and
a dielectric layer covering the gate electrode, the source electrode, the drain electrode and the buffer layer.

14. The thin film transistor according to claim 13, further comprising:
an insulator formed between the gate electrode and the source electrode and between the gate electrode and the drain electrode.

15. The thin film transistor according to claim 13, further comprising:
a first via hole exposing the gate electrode, a second via hole formed on the dielectric layer to expose the source electrode and a third via hole exposing the drain electrode; and
a gate line, a source line and a drain line spaced apart from each other and formed on a surface of the dielectric layer away from the active layer; the gate line being connected to the gate electrode through the first via hole; the source line being connected to the source electrode through the second via hole; and the drain line being connected to the drain electrode through the third via hole.

16. An array substrate comprising the thin film transistor according to claim 13.

17. An array substrate comprising the thin film transistor according to claim 14.

18. An array substrate comprising the thin film transistor according to claim 15.

19. A display panel comprising the array substrate according to claim 16.

20. A display panel comprising the array substrate according to claim 17.

* * * * *